United States Patent
Wuerstlein et al.

(10) Patent No.: US 11,025,051 B2
(45) Date of Patent: Jun. 1, 2021

(54) ELECTRONIC CONTROL UNIT

(71) Applicant: BROSE FAHRZEUGTEILE GMBH & CO. KOMMANDITGESELLSCHAFT, BAMBERG, Bamberg (DE)

(72) Inventors: Holger Wuerstlein, Zeil am Main (DE); Florian Pohl, Ebersdorf (DE); Luca Schaetzlein, Eibelstadt (DE); Stefan Mutzl, Kitzingen (DE); Johannes Stroehlein, Tschirn (DE); Maik Ruemmler, Breitenguessbach (DE)

(73) Assignee: Brose Fahrzeugteile GmbH & Co. Kommanditgesellschaft, Bamberg (DE)

( * ) Notice: Subject to any disclaimer, the term of this patent is extended or adjusted under 35 U.S.C. 154(b) by 211 days.

(21) Appl. No.: 16/261,337

(22) Filed: Jan. 29, 2019

(65) Prior Publication Data

US 2019/0237962 A1    Aug. 1, 2019

(30) Foreign Application Priority Data

Jan. 30, 2018    (DE) .......................... 102018201421.3

(51) Int. Cl.
| | |
|---|---|
| *H02H 7/00* | (2006.01) |
| *H02H 7/08* | (2006.01) |
| *H05K 5/00* | (2006.01) |
| *G01M 3/16* | (2006.01) |
| *H02H 1/00* | (2006.01) |
| *H05K 1/16* | (2006.01) |
| *H05K 5/02* | (2006.01) |

(52) U.S. Cl.
CPC ................ *H02H 7/08* (2013.01); *G01M 3/16* (2013.01); *H02H 1/0007* (2013.01); *H05K 1/16* (2013.01); *H05K 5/0026* (2013.01); *H05K 5/0247* (2013.01); *H05K 2201/10151* (2013.01)

(58) Field of Classification Search
None
See application file for complete search history.

(56) References Cited

U.S. PATENT DOCUMENTS

| | | | |
|---|---|---|---|
| 6,157,303 A | 12/2000 | Bodie et al. | |
| 6,568,264 B2 * | 5/2003 | Heger | G01F 23/265 340/618 |
| 7,190,089 B2 * | 3/2007 | Eidesheim | B60R 25/246 180/287 |
| 10,734,801 B2 * | 8/2020 | Wuerstlein | H02H 5/083 |
| 2011/0250021 A1 * | 10/2011 | Aviram | E21D 1/00 405/258.1 |

FOREIGN PATENT DOCUMENTS

| | | |
|---|---|---|
| CN | 107621489 A | 1/2018 |
| DE | 102012017755 A1 | 3/2013 |

* cited by examiner

*Primary Examiner* — Stephen W Jackson
(74) *Attorney, Agent, or Firm* — Brooks Kushman, P.C.

(57) ABSTRACT

An electronic control device for use in a motor vehicle including an electronic housing, a capacitor sensor, and a control unit. The capacitor sensor may be provided with a capacitor sensor electrode arranged inside the electronic housing. The control unit may be configured to output a trigger signal in response to receiving a measured capacitance value deviating from a threshold value, from the capacitor sensor electrode, indicative of a conductive liquid in the electronic housing.

20 Claims, 3 Drawing Sheets

ELECTRONIC CONTROL UNIT

CROSS-REFERENCE TO RELATED APPLICATIONS

This application claims priority to German Patent Application No. DE 10 2018 201 421.3 filed Jan. 30, 2018, the entire disclosure of which is incorporated by reference herein.

TECHNICAL FIELD

The present disclosure relates to an electronic control unit for use in a motor vehicle and a motor vehicle having the same.

BACKGROUND

Various (electric) motors in motor vehicles are generally controlled with the help of electronic control devices. The control devices may include an electronic power system, which is accommodated in an electronic housing, in particular being encapsulated or integrally cast. Such electronic control device includes, for example, adjusting motors for automatic adjustment of automotive parts (such as valves, doors, seats, etc.) or motors associated with ventilation equipment.

Control devices of fan motors usually depend directly on the automotive battery (without intermediate control devices, the vehicles ignition key or other switches) and are thus permanently connected to the voltage source. This is necessary with modern fan motors in particular because the fans in many cases should continue to run for a certain period of time after the vehicle has been stopped (e.g., by pulling the ignition key).

In control devices for fan motors, the penetration of liquid/water into the electronic housing is particularly problematic because the control devices may by connected directly to the battery.

Water may not only lead to a short circuit. Instead, water may also result in partial function failures of the electronic system, which may be difficult to detect under some circumstances. In particular, water can also result in creeping long-term damage, e.g., due to corrosion of conductor surfaces.

The present disclosure may provide an electronic control device for a vehicle to ensure particularly reliable operation.

SUMMARY

According to one embodiment, a control device for use in a motor vehicle is provided. The control device may include an electronic housing configured to accommodate an electronic system, which includes a circuit board, and a capacitive sensor. The electronic system may include at least one electronic power component. The capacitive sensor may include at least one capacitive sensor electrode, that may be situated inside the electronic housing, as well as a control unit, that may be equipped to detect and analyze a measured capacitance value tapped at the sensor electrode. The control unit may be equipped to output a trigger signal when the detected measured capacitance value or its deviation from a normal value fulfills a trigger criterion that is characteristic of the presence of water in the electronic housing. The water to be detected may be present as an accumulation of liquid (e.g., drops or spray), as a form of condensed moisture on a surface in the electronic housing or as atmospheric humidity (water vapor), for example. Additionally or alternatively, the control unit may also be equipped for detection of another conductive or dielectric liquid.

In other words, the electronic control device is equipped to detect water that has penetrated into the electronic housing. It may detect this by a capacitance measurement from a capacitive sensor or at least a sensor electrode of the capacitive sensor inside the electronic housing. Detection of water that has penetrated into the housing is based on the fact that the sensor electrodes act as a capacitor with respect to ground or two sensor electrodes act as a capacitor with respect to one another. This is associated with a measurable electrical capacitance, such that water in the surroundings of the sensor electrode(s) will influence this measurable capacitance.

The control device according to one or more embodiments may detect any penetration of water into the electronic housing and to do so with a marginal increase in expense and to take a suitable countermeasure. In one non-limiting example, when admission of water is detected, the electronic system may be deactivated, or a warning may be output to the user of the vehicle ("shop message").

In another embodiment, the capacitance measurement may be carried out by a charge transfer method. A capacitor of a sample-and-hold circuit of an analog digital converter (analog-to-digital-converter, ADC), which is present anyway in the control device, may be a reference capacitor. An external reference capacitor, such as that usually present with charge transfer circuits, is not provided in this case, so that the control device according to one or more embodiments, may be implemented without additional electronic components.

In another embodiment, an external reference capacitor may be used within the scope of the charge transfer method.

In another embodiment, the sensor capacitance may be measured from a measurement of impedance in which the sensor electrode is acted upon by an alternating voltage, wherein the measurement of capacitance may be based directly or indirectly on the measurement of the alternating current of resistance (impedance). For example, an integrated circuit is used for this purpose.

Other methods of measuring capacitance may also be used as an alternative.

In one embodiment the control device may include one or more sensor electrodes arranged on the circuit board of the electronic control device.

If the control device includes a plurality of capacitive sensor electrodes, then their measured values are preferably linked together in a logic AND circuit and/or in a logic OR circuit. An AND circuit advantageously permits a particularly high error suppression (false triggering), an OR circuit however permits a particularly high detection probability. Combinations are also possible.

For example, although not limited thereto, the sensor electrode (and/or the plurality of sensor electrodes) may be arranged on the circuit board:

A sensor electrode (measurement point) may be situated close to the lowest circuit board position as intended.

A plurality of sensor electrodes (measurement points) may be arranged in different positions.

A plurality of sensor electrodes (measurement points) extends with a significant extent over the circuit board to cover a comparatively large area so that penetrating water is reliably detected in various installed positions of the control device.

A plurality of sensor electrodes may be situated on a shared side of the circuit board (optionally with an opposing ground surface for shielding) or on opposing face sides of the circuit board. In one embodiment, one or more sensor electrodes may be arranged on one edge of the circuit board.

The capacitive sensor may be implemented according to a single electrode configuration (measurement of capacitance against ground) or according to a two-electrode configuration (transmitter-receiver measurement).

In one embodiment, the electronic housing of the control device may be manufactured entirely or partially of an electrically conductive material and act as one of at least two capacitive sensor electrodes in this case. The housing may be contacted by a screw, that contacts the electronic system, for example.

In another embodiment, the control unit is equipped to output the trigger signal only when a plausibility check has been carried out with a positive outcome. For example, the trigger signal is triggered only if admission of water has been detected consistently over a certain minimum period of time.

In one or more embodiments, the control unit itself or another control unit may be equipped to:
- put the control device in emergency mode (emergency operation of the motor and/or the electronic system),
- deactivate the electronic system of the control device (in particular by deactivation of the electronic system by means of an existing switchable four-pole protection),
- induce a short circuit of the electronic system to trigger a respective fuse (a fuse which has a high nominal value and is present anyway is triggered by intentionally creating a short circuit within the electronic system, so that a secure condition occurs) and/or
- output instructions to the user of the vehicle (for example, the user of the vehicle is instructed to take the vehicle to a workshop for service, in particular to replace the control device).

The polarity reversal protection mentioned above may be a component which prevents damage to the electronic system when the polarity of the electronic connections is reversed (reversal of positive and negative). Instead of a passive polarity reversal protection (diode), a switchable polarity reversal protection (semiconductor switch, e.g., MOSFET) is often used. In the embodiment referenced above, this switchable polarity reversal protection is used as an emergency off switch for the electronic system.

In another embodiment, one or more sensor electrodes may be a printed conductor formed on the circuit board. The printed conductor may be elongated, flat or meandering.

In another embodiment, the control unit may be equipped to detect the measured capacitance value:
- in control pauses of the electronic system to avoid interference,
- in sleep mode by cyclic polling,
- only in active mode and after a power on and/or
- only in power on of the electronic system to avoid interference.

The control device according to one or more embodiments may be used for controlling a fan motor in a motor vehicle. However, other use options are also possible within the scope of the invention.

A vehicle according one or more embodiments, includes a control device to the preceding description.

Another embodiment may include use of a capacitive sensor for detecting the penetration of water or some other conductive or dielectric fluid into the electronic housing of an electronic control device for use in a motor vehicle.

BRIEF DESCRIPTION OF THE DRAWINGS

Embodiments described in greater detail below on the basis of drawings, in which.

Corresponding parts and quantities are always labeled with the same reference numerals in all figures.

DETAILED DESCRIPTION

Figure 1:
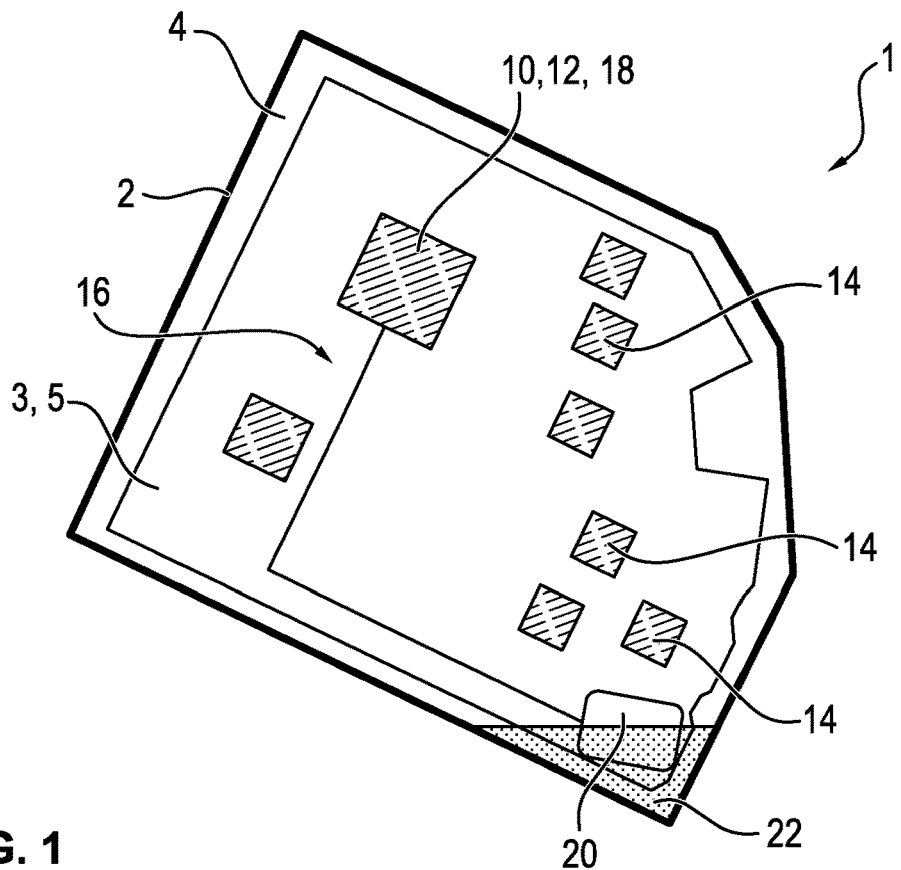
FIG. 1 shows in a schematic diagram a first embodiment of an electronic control device having an electronic housing, in which an electronic system comprising a circuit board and a capacitive sensor comprising a sensor electrode are accommodated.

FIG. 1 shows a schematic top view of an electronic control device 1 for a motor vehicle according to one or more embodiments. The control device 1 may be used as a motor control for a fan motor of the vehicle, for example.

The control device 1 include an electronic housing 2 and an electronic system 3, that may be accommodated in a housing interior 4 that may be enclosed in the electronic housing 2.

The electronic system 3 may be used to control the fan motor. The electronic system 3 may include a circuit board 5 that may have a microcontrol device 10 that may be mounted thereon. A first (motor) control unit 12 for controlling the fan motor is implemented by the microcontrol device 10. Additionally, the electronic system 3 may include additional electronic components 14 mounted on the circuit board. At least one of the components 14 may be an electronic power component such as a MOSFET.

To monitor the electronic housing 2 for protection of the electronic system 3 for penetration of water, the control device 1 may include a capacitive sensor 16. The sensor 16 may include a (sensor) control unit 18 as well as a capacitive sensor electrode 20. In one or more embodiments, the control unit 18 of the sensor 16 may be implemented by the microcontrol device 10. As indicated by the diagram, the sensor electrode 20 may be a flat electrical conductor, formed of, for example, a metal foil. The sensor electrode 20 may be mounted on the circuit board 5 at a location at the lowest end of the control device in a proper installed position of the control device 1. If, as indicated in the diagram, water 22 (a liquid or moisture in general) penetrates into the electronic housing 2, it will collect in the area of the sensor electrode 20 in the electronic housing 2.

The capacitive sensor 16 is used to detect any water 22 potentially penetrating into the electronic housing 2 and to output a trigger signal in the event such fluid is detected. Detection may be based on the fact that penetrating water 22 causes a change in the sensor capacitance. The control unit 18 is equipped accordingly to compare a measured capacitance value CSensor picked up at the sensor electrode 20 with a normal value that has been stored and was measured in the absence of water on the sensor electrode 20. The control unit 18 may also be equipped to output the trigger signal when the deviation of the measured capacitance value CSensor from the normal value exceeds a threshold value established as the trigger criterion. For example, the trigger signal is output when the detected measured capacitance value C Sensor amounts to more than 130% of the normal value measured in the absence of water. To reduce the probability of a faulty triggering due to drift or manufacturing tolerances, the trigger signal may alternatively output when the detected measured capacitance value CSensor amounts to more than 150% of the normal value measured in the absence of water. Alternatively, when there is a large electrode surface and therefore the basic capacitance of the capacitive sensor is high, the trigger signal is output when the detected measured capacitance value C Sensor amounts to more than 110% of the normal value measured in the absence of water.

Figure 2:
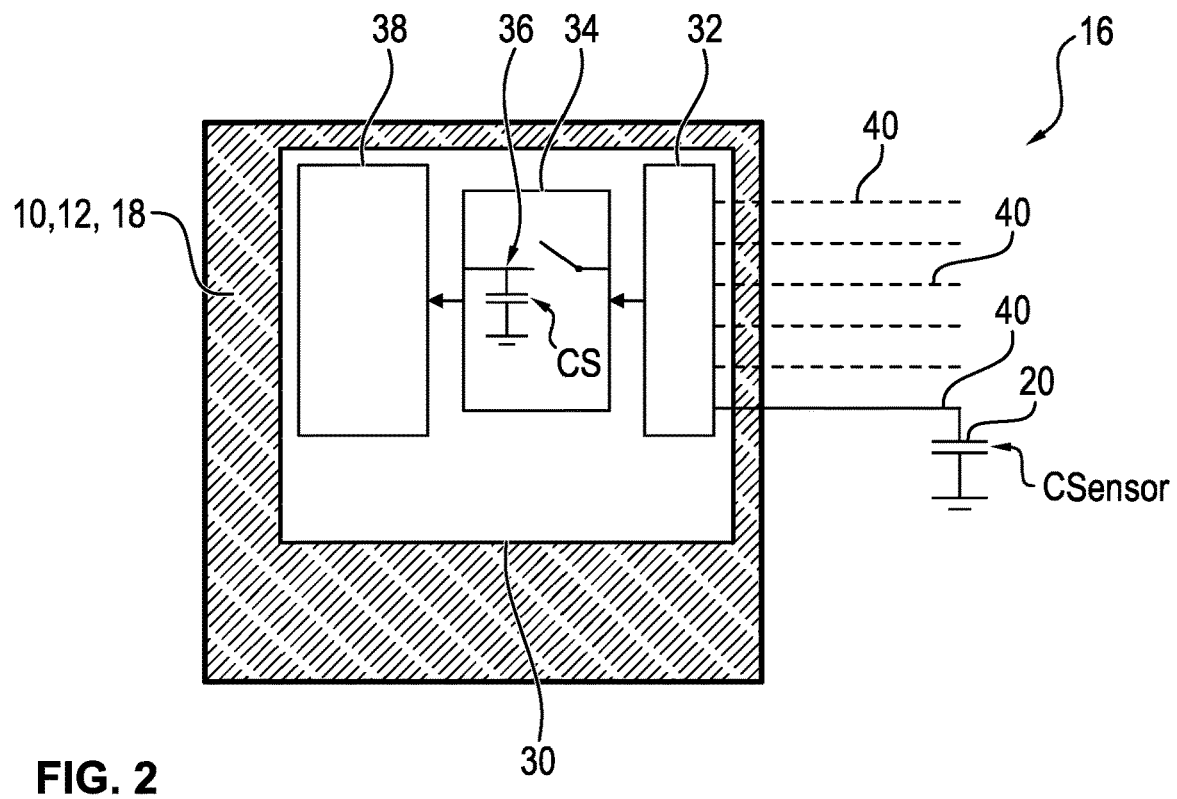
FIG. 2 shows a schematic diagram of the sensor according to FIG. 1 wherein a charge transfer circuit is used to detect the sensor capacitance, wherein a capacitor of a sample-and-hold element of an AD converter is used as the reference capacitor, FIGS. 3 to 5 each show the electronic system according to FIG. 1 in different embodiments.

The capacitance may be measured here according to the charge transfer method, as described below with reference to FIG. 2. FIG. 2 shows a single diagram of the capacitive sensor 16, specifically the microcontrol device 10, and the sensor electrode 20. The microcontrol device 10 may include an analog digital converter 30 (ADC) that may include a multiplexer 32, a sample-and-hold member 34, that may include a reference capacitor 36 with a fixed reference capacitance CS, as well as a conversion member 38 for a digital voltage measurement. The analog digital converter 30 may include a plurality of inputs 40, that may be polled cyclically via the multiplexer 32. This sensor electrode 20 may be connected to one of the inputs 40.

During operation of the sensor 16, the capacitance CSensor of the sensor electrode 20 may be detected as follows:
1. Switch the sensor pin as the output to high:
Charge C Sensor to +5 V.
2. Switch the sensor pin to a high resistance (tristate):
CSensor remains charged with Q=U*C Sensor.
3. Switch the sensor pin to AD conversion:
Microcontrol device 10 discharges the reference capacitance CS to 0 volt; multiplexer 32 selects the channel, then sampling may be performed by the sample-and-hold member 34, whereupon the charge of the sensor capacitance may be balanced between the two capacitors:

$$USample=Q/(CSensor+CS)$$

4. Convert the sampled voltage.
5. Determine the capacitance from the digital value of the voltage by simple computation operations.

To implement the charge transfer circuit, only electronic components that are already a part of the electronic control device 1 are used, as shown here, so that the desired liquid detection is implemented in a particularly uncomplicated manner. In one alternative not shown here, an external reference capacitor is provided instead of the reference capacitor 36, which belongs to the sample-and-hold member 34.

Figure 3:
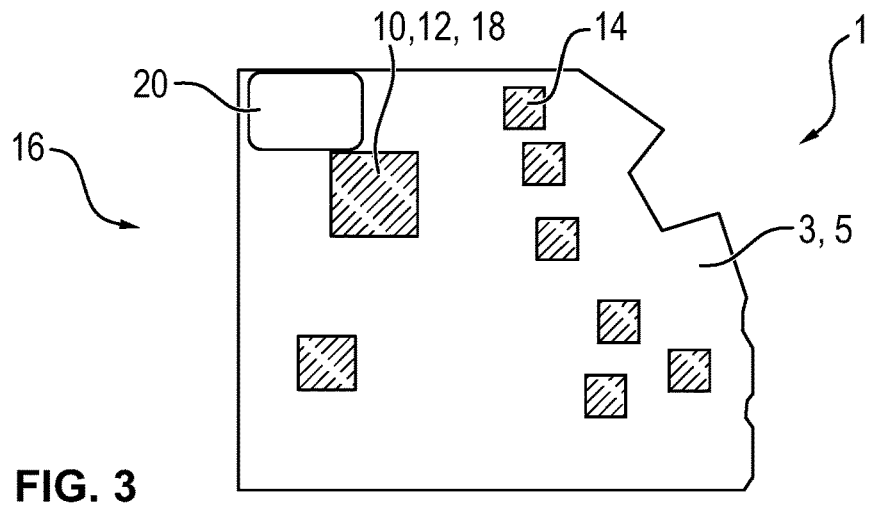
Figure 4:
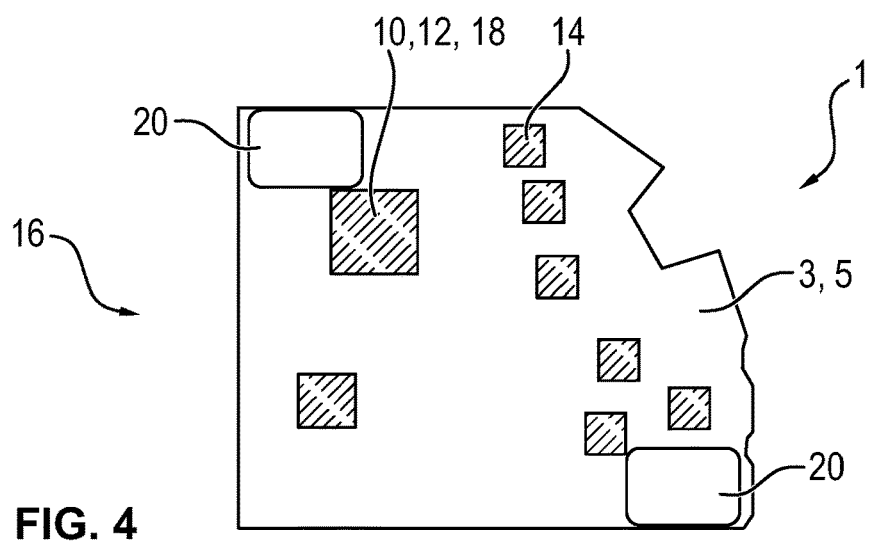
Figure 5:
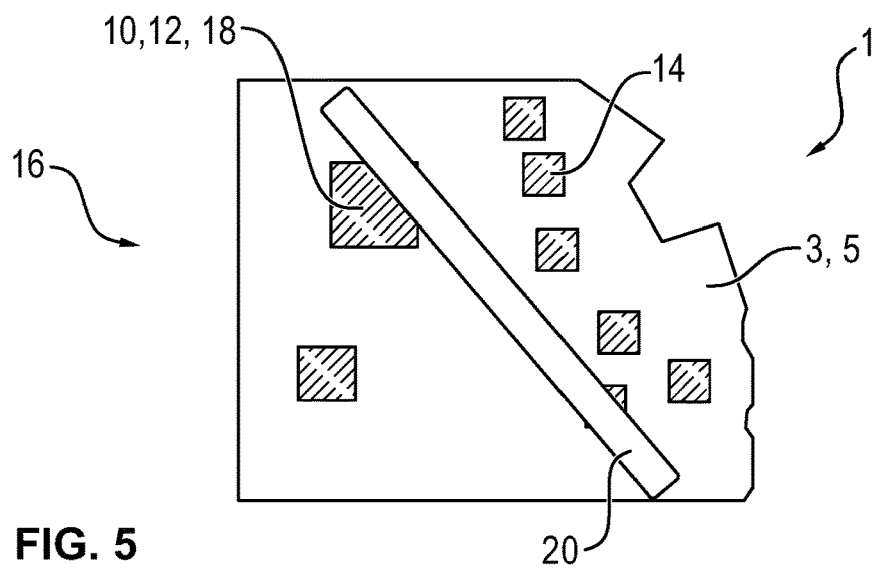

FIGS. 3 to 5 each show a single diagram of the electronic system 3 of the control device 1 according to FIG. 1, wherein different embodiments are shown with regard to the arrangement of the sensor electrode 20. According to FIG. 3 the flat sensor electrode 20 is placed close to the microcontrol device 10 in order to implement a method of monitoring for moisture in this area.

According to FIG. 4, the control device 1 includes, for example, two sensor electrodes 20 (alternatively, more than two sensor electrodes), that may be arranged in opposite corners of the circuit board 5. This permits prompt detection of any water that has penetrated regardless of the installed position of the control device 1.

According to FIG. 5, the sensor electrode 20 is a flat strip extending longitudinally, spanning the circuit board 3 approximately along surface diagonals of the circuit board 5. Again, in this case, prompt detection of any water that has penetrated is made possible, regardless of the installed position.

In another embodiment, the capacitive sensor 16 includes two sensor electrodes 20 arranged on the circuit board 5 and wired according to the two-electrode principle. During operation of the sensor 16, one of the sensor electrodes 20 is equipped as a transmitting electrode while the other sensor electrode 20 is equipped as a receiving electrode.

Figure 6:
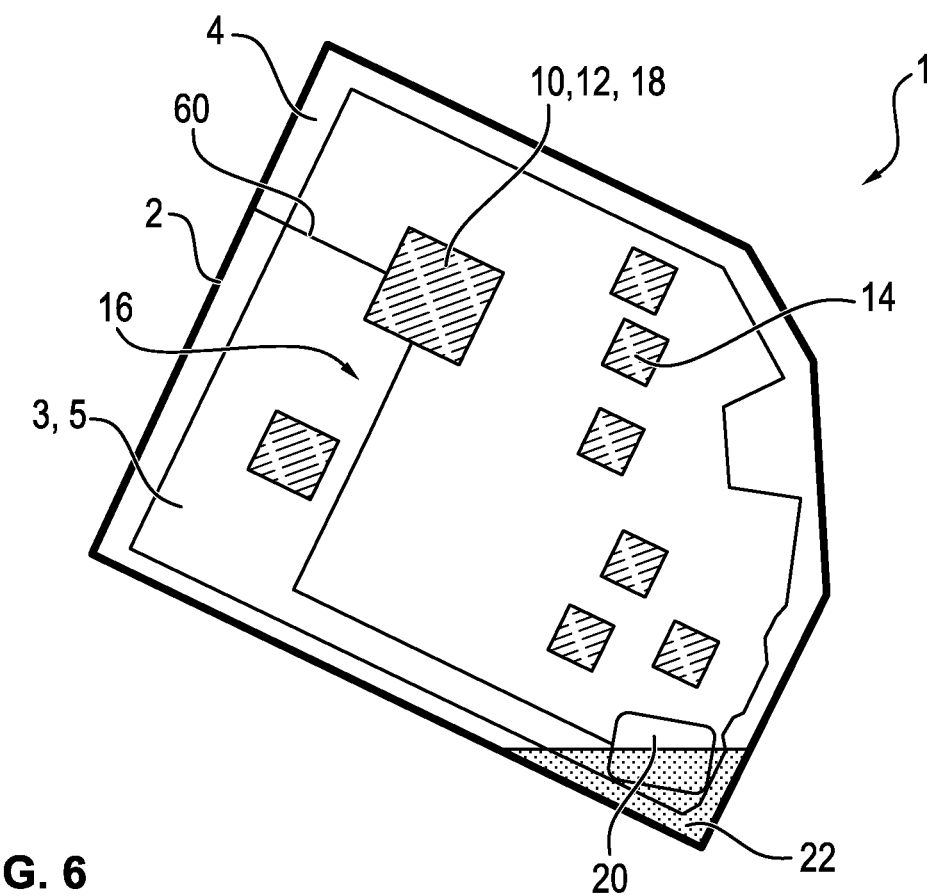
FIG. 6 shows a diagram according to FIG. 1 of a second embodiment of the control device, in which the electronic housing is made of an electrically conductive material and acts as one of two sensor electrodes of the capacitive sensor.

FIG. 6 shows an alternative embodiment of the electronic control device 1 which corresponds largely to the embodiment according to FIG. 1. In the embodiment according to FIG. 6 the electronic housing 2 is manufactured from an electrically conductive material. The electronic housing 2 may be made of die-cast aluminum, for example. The control device 1 may include a first (similar to the embodiment according to FIG. 1) sensor electrode 20 arranged in the lower corner of the circuit board 5. However, the electronic housing 2 may function here as the second sensor electrode 20. The electronic housing 2 may be electrically connected to the microcontrol device 10, such as the control unit 18 by a connection 60. The sensor 16 in this case may again be configured according to the two-electrode principle.

Regardless of the embodiment, the control unit 18 is equipped in particular to output the trigger signal only when a plausibility check has been carried out with a positive outcome. For example, the trigger signal is issued only when the aforementioned threshold value is exceeded continuously over a defined period of time.

In response to the trigger signal, the control unit 18, for example, or a higher-level control unit, ensures that:
the control device 1 is put in an emergency mode (emergency running of the motor and/or the electronic system),
the electronic system 3 of the control device 1 is deactivated (in particular the electronic system 3 may be deactivated by an existing switchable polarity reversal protection),
a short circuit of the electronic system 3 may be generated intentionally (in particular with electronic power modules that are present anyway, e.g., MOSFETs of a motor control) to trigger the respective fuse (by intentionally creating a short circuit within the electronic system 3, a fuse that is present anyway is triggered with a high nominal value, for a safe condition) and/or
instructions may be output to the user of the vehicle (for example, the user of the vehicle is instructed by a warning lamp near the driver's seat to take the vehicle to a workshop for service, to replace the control device 1).

The present invention is especially clear on the basis of the embodiments described above but the invention is not limited to these embodiments. Instead additional embodiments of the invention can be derived from the claims and the preceding description.

LIST OF REFERENCE NUMERALS

1 Control device
2 Electronic housing
3 Electronic system
4 Housing interior
5 Circuit board
10 Microcontrol device
12 (Motor) control unit
14 Component 16 (Capacitive) sensor
18 (Sensor) control unit
20 Sensor electrode
22 Water
30 Analog-digital converter
32 Multiplexer
34 Sample-and-hold member
36 Reference capacitor
38 Conversion member
40 Input
60 Connection
CS Reference capacitance
CSensor Measured capacitance value

What is claimed is:

1. An electronic control device for use in a motor vehicle, the electronic control device comprising:
a an electronic housing;
a capacitor sensor provided with a first capacitor sensor electrode arranged inside the electronic housing; and
a control unit configured to output a trigger signal in response to receiving a measured capacitance value deviating from a threshold value, from the capacitor sensor electrode, indicative of a conductive liquid in the electronic housing.

2. The electronic control device of claim 1, wherein the measured capacitance value is detected by means of a charge transfer method.

3. The electronic control device of claim 1, wherein the capacitor sensor includes,
a sensor pin,
a microcontrol device electrically connected to the first capacitor sensor electrode,
an analog-digital-converter including
a multiplexer,
a sample-and-hold member provided with a second capacitor sensor electrode, and
a conversion member configured to measure a digital voltage,
wherein the capacitor sensor is configured to:
increase an output voltage of the sensor pin to at least 4 volts,
increase a resistance of the sensor pin,
switch the sensor pin to analog-digital conversion,
discharge the second capacitor sensor electrode to decrease a voltage of the second capacitor sensor electrode,
instruct the sample-and-hold member to sample a voltage of the capacitor sensor electrode,
convert the sampled voltage to receive a digital value, and
determine the capacitance from the digital value.

4. The electronic control device of claim 3, wherein the analog-digital-converter is a reference capacitor.

5. The electronic control device of claim 1, further comprising a circuit board disposed within the electronic housing, wherein the sensor electrode is arranged on the circuit board.

6. The electronic control device of claim 5, wherein the first capacitor sensor electrode is a printed conductor formed on the circuit board.

7. The electronic control device of claim 1, wherein the electronic housing is formed of an electrically conductive material configured to provide a second measured capacitance to the control unit.

8. The electronic control device of claim 1, wherein the control unit is further configured to output the trigger signal in response to the measured capacitance value deviating from the threshold value for a defined period of time.

9. The electronic control device of claim 1, wherein the control unit is further configured to output the trigger signal in response to the measured capacitance value continuously deviating from the threshold value for a defined period of time.

10. The electronic control device of claim 1, wherein the control unit is further configured to change a mode of the electronic control device to an emergency mode.

11. A control device for use in a vehicle, the control device comprising:
an electronic housing including a portion configured to collect a liquid within the electronic housing; and
an electronic system including
a capacitive sensor disposed within the electronic housing and including,
a circuit board, and
a sensor electrode arranged on the circuit board and configured to measure a capacitance of the collected liquid.

12. The control device of claim 11, wherein the sensor electrode extends diagonally across the circuit board.

13. The control device of claim 11, wherein the electronic housing defines a top edge and a bottom edge disposed below the top edge, and wherein the portion configured to collect the liquid is disposed along at least a portion of the bottom edge.

14. The control device of claim 11, further comprising:
a motor control unit configured to communicate with an electric motor; and
a second sensor electrode arranged on the circuit board and positioned adjacent to the motor control unit, wherein the second sensor electrode is configured to measure a capacitance of a liquid disposed on the motor control unit.

15. A control device for use in a vehicle, the control device comprising:
a housing; and
an electronic system including,
a capacitive sensor disposed within the housing and including a circuit board and a first sensor electrode arranged on the circuit board, and
a microcontrol device operatively connected to an electric fan motor configured to, responsive to a measured capacitance value, received from the first sensor electrode, deviating from a threshold value, reverse a polarity of the electronic system.

16. The control device of claim 15, further comprising a MOSFET provided with a fuse, wherein the microcontrol device is further configured to trigger the fuse of the MOSFET.

17. The control device of claim 15, wherein the microcontrol device is further configured to provide a signal to a warning lamp to warn a user within the vehicle.

18. The control device of claim 15, wherein the measured capacitance value is based on an impedance of an alternating voltage of the electronic system.

19. The control device of claim 15, further comprising a second sensor electrode, wherein the first sensor electrode and the second sensor electrode are linked together in a logic AND circuit.

20. The control device of claim 19, wherein the first sensor electrode and the second sensor electrode are linked together in a logic OR circuit.

* * * * *